(12) United States Patent
Ruehli et al.

(10) Patent No.: US 7,546,230 B2
(45) Date of Patent: Jun. 9, 2009

(54) ELECTROMAGNETIC RESPONSE MODEL WITH IMPROVED HIGH FREQUENCY STABILITY

(75) Inventors: Albert E. Ruehli, Chappaqua, NY (US); Chuanyi Yang, Seattle, WA (US)

(73) Assignee: International Business Machines Corporation, Armonk, NY (US)

( * ) Notice: Subject to any disclaimer, the term of this patent is extended or adjusted under 35 U.S.C. 154(b) by 681 days.

(21) Appl. No.: 11/108,392

(22) Filed: Apr. 18, 2005

(65) Prior Publication Data

US 2006/0235672 A1    Oct. 19, 2006

(51) Int. Cl.
*G06F 17/50* (2006.01)
*H03B 1/00* (2006.01)
*G01R 15/00* (2006.01)
*G01R 23/00* (2006.01)
*H02M 1/14* (2006.01)
*G05F 3/16* (2006.01)

(52) U.S. Cl. ............... 703/14; 327/552; 702/57; 702/75; 323/222; 323/225; 363/47

(58) Field of Classification Search ............. 703/14; 702/57, 75; 323/222, 225; 363/47; 327/552
See application file for complete search history.

(56) References Cited

U.S. PATENT DOCUMENTS 5,530,396 A * 6/1996 Vlatkovic et al. ........... 327/552
5,826,215 A * 10/1998 Garrett et al. ................. 702/75
5,844,790 A * 12/1998 Jacobs et al. ................. 363/47
6,259,613 B1 * 7/2001 Lee et al. ..................... 363/89

OTHER PUBLICATIONS

Garrett et al. "Accuracy and Stability Improvements of Integral Equation Models Using the Partial Element Equivalent Circuit (PEEC) Approach" IEEE Transactions on Antennas and Propagation: Dec. 1998.*
"Filter Comparison": The Scientists and Engineer's Guide to Digital Signal Processing. 2001.*
Hwang et al. "Treating Late-Time Instability of Hybrid Finite-Element/Finite-Difference Time-Domain Method" IEEE Transactions on Antennas and Propagation, vol. 47, No. 2, Feb. 1999.*
Sadigh et al. "Treating the Instabilities in Marching-on-in-Time Method from a Different Perspective" IEEE Transactions on Antennas and Propagation, vol. 41, No. 12, Dec. 1993.*

* cited by examiner

*Primary Examiner*—Kamini S Shah
*Assistant Examiner*—Shambhavi Patel
(74) *Attorney, Agent, or Firm*—Law Office of Charles W. Peterson, Jr.; Brian P. Verminski, Esq.

(57) ABSTRACT

A model for modeling electromagnetic response in a conductor and in dielectric, a method of modeling the electromagnetic response in the conductor and dielectric and a program product therefor. Coupled supplies (delayed capacitive-current-controlled current sources or delayed inductance-voltage-controlled voltage sources) are low pass filtered in an electromagnetic model for the particular medium, e.g., a Partial Element Equivalent Circuit (PEEC) model for a conductor or dielectric. Thus, high frequency model instabilities are substantially reduced or eliminated.

10 Claims, 2 Drawing Sheets

ELECTROMAGNETIC RESPONSE MODEL WITH IMPROVED HIGH FREQUENCY STABILITY

FIELD OF THE INVENTION

The present invention generally relates to modeling electromagnetic effects and more particularly, to modeling electromagnetic effects on circuit interconnects.

BACKGROUND DESCRIPTION

Electrical responses in physical structures to electrical forces (e.g., capacitive response to varying voltage or inductive response to varying current) are well known and circuits are easily modeled. Electromagnetic responses in these same physical structures are equally well known, but are much less easily modeled. Thus, electrical circuit analogs are typically used to model electromagnetic responses. One well-known circuit based approach for modeling electromagnetic responses is known as the Partial Element Equivalent Circuit (PEEC) model. A typical PEEC model is numerically equivalent to a full wave method like the method of moments (MoM) solution with Galerkin matching. Simple PEEC models (that do not involve delays) provide an adequate frequency response approximation in a well-defined low frequency range. PEEC models may be used, for example, to model interconnects in Integrated Circuit (IC) package wiring and inter-package connections. Further, these simple PEEC models have been used to model simple and complex interconnect conditions in a conventional circuit modeling program, e.g., SPICE or ASTAP, for both time and frequency domain modeling.

However, typical state of the art PEEC models (as well as other time domain integral equation models/solutions) are known to include instabilities above $f_{active}$, also known as late time instability where $f_{active}$ is the highest frequency of interest for the modeling. Resistors, inductors and capacitors model as ideal elements (i.e., pure resistance, pure inductance and pure capacitance), where ideal elements do not exist in nature. Further, an LC network or an RLC network only provides an analogous electrical-response approximation to electromagnetic effects. Thus, the instabilities are clearly non-physical, i.e., although the instabilities do not occur in the physical structure being modeled, they are inherent in the circuit model.

Unfortunately, previous attempts to eliminate this time domain instability have met with only partial success. Models utilizing implicit time integration methods such as the backward Euler formula, for example, have proven more stable than explicit method based models like the forward Euler method. Another partially successful example is coefficient subdivision (+PEEC), where the useful frequency range or active range, $f_{active}$, is extended by subdividing or segmenting the partial elements in the PEEC model into smaller and smaller segments. Also, dampening resistors may be included (R+PEEC), e.g., in parallel with calculated partial inductances, to reduce model resonance above $f_{active}$. Consequently, these approaches have only marginally increased PEEC model stability.

This high frequency instability problem causes an exponential increase in the time domain response. This exponential response increase is accompanied by an increase in computer processing time, i.e., calculating the exponentially increasing response is accompanied by an increase in computer resources needed to converge on a solution. Prior art approaches to addressing this instability have also increased demand for computer resources. For example, coefficient subdivision requires further segmenting the model to extend the frequency range with each additional segment proportionately increasing computer resources needed. Including damping resistors further adds to the network complexity and, accordingly, increases computer resources needed for processing the increasingly complex model. Consequently, problems with this anomalous high frequency response have offset many of the advantages of using this otherwise very efficient modeling approach (+PEEC or R+PEEC) for these normally (even well below $f_{active}$) complex time domain problems, e.g., modeling electromagnetic responses in interconnects. Further, for higher performance applications, where the switching signal spectrum approaches $f_{active}$ and, correspondingly, signal edge rise and fall times decrease dramatically, model instabilities are inevitable using these prior art electromagnetic models.

Thus, there is a need for a model for electromagnetic responses in physical structures that is free of instabilities in the extended frequency range, even beyond the typical useful frequency range or active range ($f_{active}$), and especially for such a PEEC model.

SUMMARY OF THE INVENTION

It is a purpose of the invention to improve electromagnetic response modeling;

It is another purpose of the invention to extend the frequency range in electromagnetic models;

It is yet another purpose of the invention to minimize high frequency instabilities in electromagnetic models;

It is yet another purpose of the invention to minimize high frequency instabilities, thereby extending the frequency range in electromagnetic models;

It is yet another purpose of the invention to minimize high frequency instabilities in Partial Element Equivalent Circuit (PEEC) models.

The present invention relates to a model for modeling electromagnetic response in a conductor and in dielectric, a method of modeling the electromagnetic response and a program product therefor. Coupled supplies (delayed capacitive-current-controlled current sources or delayed inductance-voltage-controlled voltage sources) are low pass filtered in a conductor/dielectric model for a Partial Element Equivalent Circuit (PEEC) model. A series resistance is modeled with each reactive element in the PEEC model. Thus, high frequency model instabilities are substantially reduced or eliminated.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
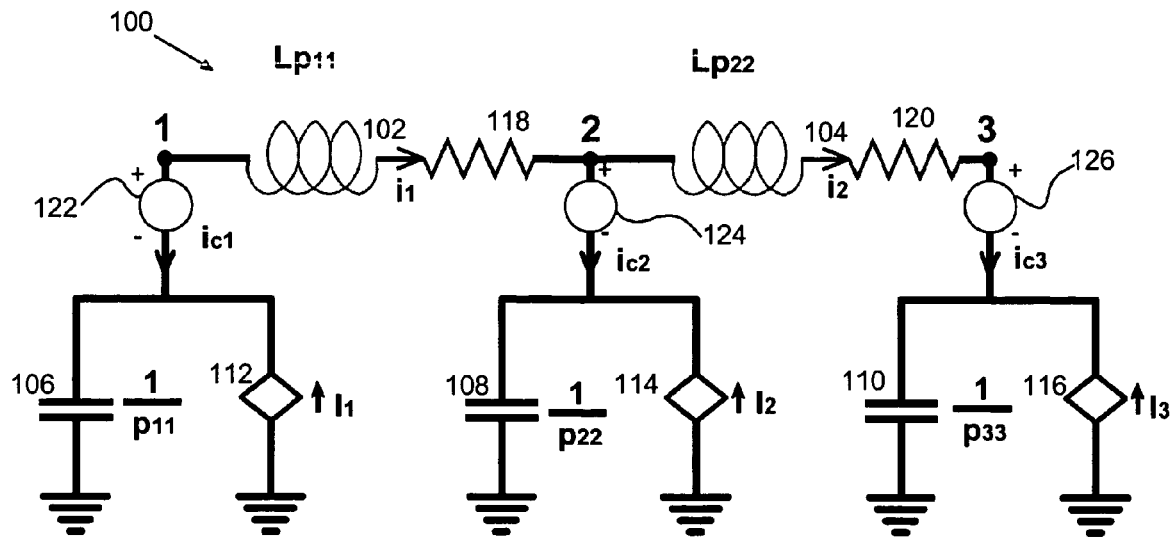
FIGS. 1A-B show simple prior art electromagnetic response models in a network for modeling electromagnetic effects.
Figure 1B:
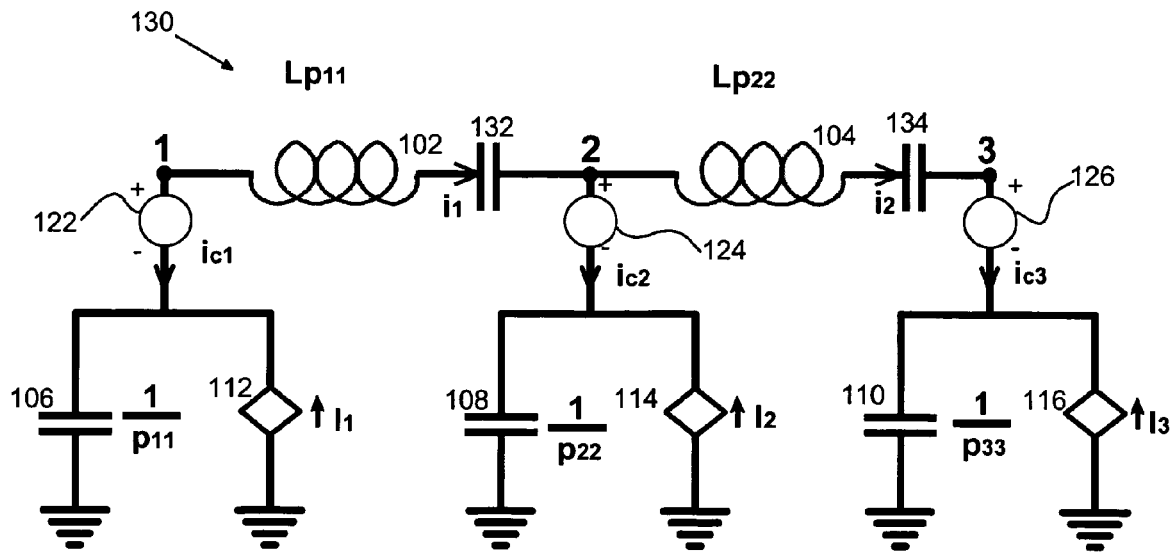

Turning now to the drawings, and more particularly FIGS. 1A-B show simple prior art electromagnetic response models for modeling electromagnetic effects in a particular medium, i.e., in a conductor or in a dielectric. It should be noted that all circuit models described herein may be transformed to loop equations with and appropriate Norton to Thevenin transformation. The example of FIG. 1A shows a prior network model 100 for modeling electromagnetic effects in an interconnect such as in electronic package wiring, or, an Integrated Circuit (IC) package interconnect. In particular, the network 100 has the general form of the basic Partial Element Equivalent Circuit (PEEC) model for modified nodal analysis (MNA) of a length of a single isolated conductor with distributed (along the length) inductance modeled as partial inductances in series connected inductors 102, 104. Conductor capacitance is modeled as distributed lump capacitances in branch capacitors 106, 108, 110. The branch capacitors 106, 108, 110 are in parallel with capacitive-current controlled current sources, $I_1$, $I_2$, $I_3$, respectively, 112, 114, 116. Capacitive-current controlled current sources 112, 114, 116 may be delayed capacitive-current controlled current sources or, treated as undelayed for sufficiently small geometries. Series resistors 118, 120 represent the resistance of the respective corresponding inductor 102, 104. Branch voltages sources 122, 124, 126 are zero volt voltage sources included for measuring branch current, i.e., current ($i_{c1}$, $i_{c2}$, $i_{c3}$) through the voltages source 122, 124, 126 is the respective branch current. Although this simple example 100 includes only 3 branches bracketing segments of partial inductors 102, 104, a model for a typical interconnect (e.g., an IC module land, via, pin and etc.) or, even a long high frequency signal path, is much more complex and typically requires a correspondingly much more complex PEEC model.

FIG. 1B shows a network example 130 of an analogous model for dielectrics with like elements labeled identically. So, in this example, instead of series resistors 118, 120, series capacitors 132, 134 are included in series with inductors 102, 104. Again a typical dielectric model is much more complex and typically requires a correspondingly much more complex PEEC model.

It should be noted that the simple prior art model 100 (as well as even much more complex such network models) is stable absent considerations for spatial delays. A normal signal travels unimpeded and independent of electrical delays at the speed of light (c) along a particular distance (s), such as the distance between corresponding inductors (L) 102, 104 with a time or spatial delay (τ) determined by τ=s/c. Thus, the spatial delay is modeled as, simply, a time delay in the respective capacitive-current controlled current source 112, 114, 116, as well as the mutual inductance coupling between partial inductor elements 102 and 104. Without spatial delays (i.e., setting τ=0 in each capacitive-current controlled current sources 112, 114, 116), however, the inductive coupling through the partial inductance and the capacitive current controlled current sources forms a stable and passive circuit. Further, an equivalent RC network (e.g., replacing inductive reactance with equivalent resistance) is inherently stable even when capacitive-current controlled current sources 112, 114, 116 include spatial delays, i.e., where τ>0.

Unfortunately, for this simple PEEC model 100, once spatial delays are modeled with the electrical response, a so-called full-wave model does not remain stable at high frequencies and may exhibit these instabilities because of faster rise and fall times at markedly higher frequencies, i.e., normally above $f_{active}$. For this simple network model 100, inductive coupling voltage sources have the general form $$v_L = Lp \frac{di(t-\tau)}{dt}$$

and current dependent current sources are defined by the capacitive couplings with the form $$I_{Ck} = \frac{p_{km}}{p_{mm}} i_c(t-\tau).$$

While even this simple PEEC model 100 suffers from instability at high frequencies, this instability becomes much more difficult and complex problem as the number of reactive partial elements increases. So, for a more complex model, where each modeled length of conductor includes an inductance related to a corresponding distance between the conductor and a corresponding different spatial delay (τ) associated with and dependent upon each length.

It has been shown that false resonances cause these late time instabilities in prior art models. Further, U.S. Pat. No. 5,826,215 entitled "Method and Computer Program Product for Stable Integral Equation Models," to Garrett et al., (Garrett) assigned to the assignee of the present invention and incorporated herein by reference teaches a computer-readable medium for use with a computer and, that false resonances that arise from coupling phase differences between the partial inductances and also differences between voltage potential coefficients. To mitigate these model instabilities, Garrett teaches segmenting the model further and including dampening resistors in parallel with the partial inductances. Unfortunately, Garrett's solution may result in new eigenvalues, each of which may support high frequency instability. Additionally, this problem has been investigated from a mathematical point of view using a class of mathematical formulations that are called delay differential equations (DDE). Also, without offering any solutions, there is an existing theory that some of these modeled instabilities are real. By contrast, the present invention overcomes these faster rise time problems to handle higher performance signals with faster rise times to arrive at more stable solutions.

Although the above instability for typical high frequency interconnects with numerous basic loops 100 is well known, the source of this instability is previously unknown and unrecognized. In particular, the instability occurs because of capacitive currents and inductive voltages that are coupled to a multitude of delayed, wide spectrum sources, i.e., the spatial delays (τ). Thus, having identified the source of instability, the typical state of the art PEEC model may be modified to alleviate/eliminate the instability. For example, low pass (digital or analog) filters may be included in the model to filter the high frequencies from the coupled inductive and capacitive sources. Accordingly, since the problem frequencies are much higher than the highest active frequency, $f_{active}$, filtering frequencies above the highest active frequency does not alter the spectrum for the modeled response of interest.

Figure 2A:
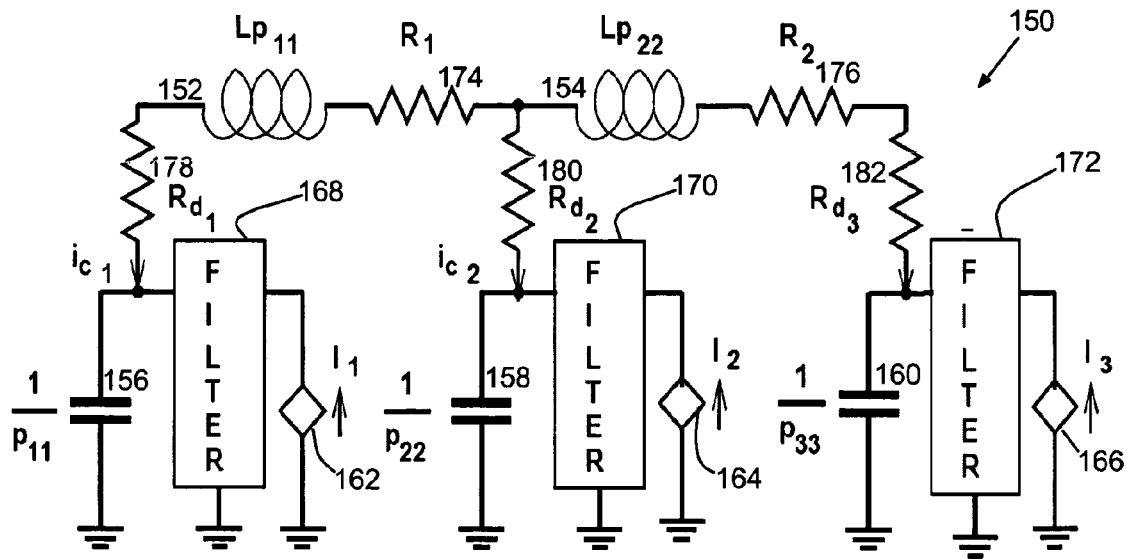
FIG. 2 shows an example of a preferred embodiment PEEC model with improved high frequency stability according to the present invention.
Figure 2B:
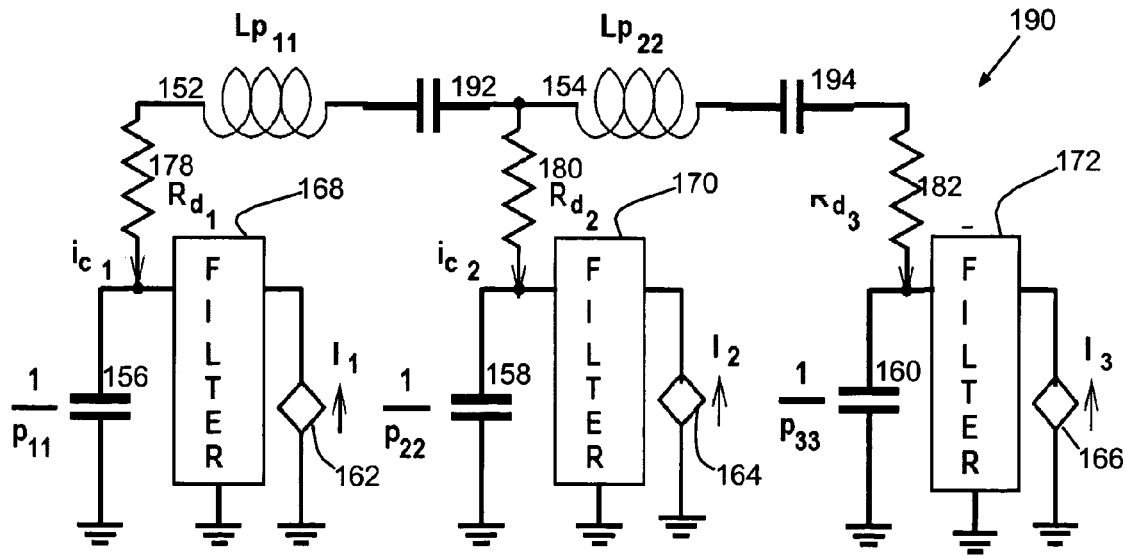

FIGS. 2A-B show examples of preferred embodiment PEEC conductor and dielectric models for improved high frequency stability according to the present invention. The preferred model may be used on any suitable general purpose computer with suitable resources. As with the simple PEEC conductor model 100 of the example of FIG. 1A, the preferred conductor model 150 includes partial inductances 152, 154, distributed lump capacitance capacitors 156, 158, 160 and capacitive-current-controlled current sources, 162, 164, 166. In addition, however, the preferred conductor model 150 includes low pass filters 168, 170, 172 inserted between the respective distributed lump capacitance capacitors 156, 158, 160 and capacitive-current-controlled current sources, 162, 164, 166. Low pass filters 168, 170, 172 may be digital or analog filters. Series resistors 174, 176 represent the series resistance of the corresponding inductors 152, 154, respectively. Also, in this example, branch resistors 178, 180, 182 separate the capacitor/capacitive current controlled current source branches from the partial inductance links. A similar low pass filter (not shown) may be included to filter the delayed inductive coupling between inductors 152, 154.

Similarly, FIG. 2B shows a network example 190 of an analogous preferred model for dielectrics with like elements labeled identically. Again in this example, instead of series resistors 174, 176, series capacitors 192, 194 are included in series with inductors 152, 154.

Preferably, to minimize distortion across the active range, the low pass filters 168, 170, 172 have an upper frequency or cut-off frequency selected at least twice $f_{active}$ and, most preferably, orders of magnitude greater than $f_{active}$, e.g., $10 f_{active}$. The preferred low pass filters 168, 170, 172 block high frequencies that may originate in model supplies, i.e., the delayed capacitive-current-controlled current sources 162, 164, 166, in this example. Similarly, in a model with delayed inductance-voltage-controlled voltage sources, low pass filters may be inserted between the inductance-voltage controlled voltage sources and the passive portion of the network. Also, branch resistors 178, 180, 182 of this example add zeros to the network transfer function that help the filtering of unintended oscillations in the LC partial elements. So, only those frequencies well above $f_{active}$ are removed from the current as it passes from the particular delayed capacitive-current-controlled current sources 162, 164, 166 to the rest of the network 150. As a result, the active range frequency response is represented accurately and with much reduced susceptibility to instabilities by the preferred model.

Advantageously, the spectrum for the preferred time domain model is accurate at least to the maximum operating frequency, i.e., over the active range. The preferred PEEC model is largely free of instability previously caused by very high-frequency coupled signals that may occur and even with the wrong amplitude and phase. As a result, the preferred PEEC model is very accurate even at the very high frequencies with the low pass filters reducing high frequency capacitive and inductive coupling factors, $p_{km}/p_{mm}$ and Lp, respectively. The basic PEEC cell model 100 may require the usual SPICE type zero voltage sources in FIG. 1A to find the couplings for the capacitive coupling using modified nodal analysis approach. Thus, as is evident from the example of FIGS. 2A-B, branch resistors 178, 180, 182 have replaced zero voltage sources. So, only modest additional processing resources for filter elements, since added elements are uncoupled. Further, the preferred embodiment model is has application to many other time domain integral equation formulations that may be represented as an integral equation.

While the invention has been described in terms of preferred embodiments, those skilled in the art will recognize that the invention can be practiced with modification within the spirit and scope of the appended claims. It is intended that all such variations and modifications fall within the scope of the appended claims.

What is claimed is:

1. A computer-readable medium having stored thereon a plurality of instructions for circuit design modeling electromagnetic responses in a particular circuit interconnect medium, the plurality of instructions including instructions that, when executed by a processor, cause the processor to:
   a) model said medium as a Partial Element Equivalent Circuit (PEEC) model of a network of passive elements having an active operating frequency range ($f_{active}$) and coupled power supplies,
   said coupled supplies being delayed (τ) capacitive-current-controlled current sources having the form $$I_{Ck} = \frac{p_{km}}{p_{mm}} i_c(t-\tau),$$

and delayed inductance-voltage-controlled voltage sources having the form $$v_L = Lp \frac{di(t-\tau)}{dt},$$

and providing power responsive to conduction in at least one corresponding coupled passive element, where $i_c$ is branch current and $p_{km}/p_{mm}$ and Lp are capacitive and inductive coupling factors, respectively; and
   b) low pass filter each of said coupled supplies comprising inserting a low pass filter between each of said capacitive-current-controlled current sources and said passive elements in said PEEC model, wherein said coupled supplies are low pass filtered to block frequencies at least 2 times $f_{active}$, the processor selectively storing the low pass filter results in a computer-readable medium.

2. A computer-readable medium as in claim 1, wherein said low pass filter is a digital filter.

3. A computer-readable medium as in claim 1, wherein said low pass filter is a analog filter.

4. A computer-readable medium as in claim 1, wherein said PEEC model is an LC model, said instructions, when executed by a processor, further causing the processor to:
   c) insert resistors in series with each capacitor and each resistor in said PEEC model.

5. A computer-readable medium as in claim 1, wherein said medium is a conductor.

6. A computer program product for circuit design modeling circuit interconnect electromagnetic responses, said computer program product comprising a computer usable medium having computer readable program code thereon, said computer readable program code comprising:
   computer readable program code means for modeling passive circuit elements in an LC network as a Partial Element Equivalent Circuit (PEEC) model having an active operating frequency range ($f_{active}$);
   computer readable program code means for modeling coupled power supplies including delayed (τ) capacitive-current-controlled current sources having the form $$I_{Ck} = \frac{p_{km}}{p_{mm}} i_c(t-\tau),$$

and delayed inductance-voltage-controlled voltage sources having the form $$v_L = Lp\frac{di(t-\tau)}{dt},$$

where $i_c$ is branch current and $p_{km}/p_{mm}$ and Lp are capacitive and inductive coupling factors, respectively;

computer readable program code means for modeling low pass filters between said LC network and each of said coupled power supplies;

computer readable program code means for representing conductors and dielectric as a combination of modeled said passive circuit elements and modeled said coupled power supplies, each of said modeled coupled power supplies being low pass filtered by a low pass filter having a cut-off frequency at least 2 times $f_{active}$; and computer readable program code means for storing represented said conductors and dielectric in a computer-readable medium.

7. A computer program product as in claim 6, wherein said cut-off frequency is at least an order of magnitude greater than $f_{active}$.

8. A computer program product as in claim 6, wherein said computer readable program code means for modeling low pass filters comprises computer readable program code means for modeling digital filters.

9. A computer program product as in claim 6, wherein said computer readable program code means for modeling low pass filters comprises computer readable program code means for modeling analog filters.

10. A computer program product as in claim 6, further comprising computer readable program code means for modeling a resistor in series with each capacitor and resistor in said LC network.

* * * * *